(12) United States Patent
Chou et al.

(10) Patent No.: US 7,266,803 B2
(45) Date of Patent: Sep. 4, 2007

(54) LAYOUT GENERATION AND OPTIMIZATION TO IMPROVE PHOTOLITHOGRAPHIC PERFORMANCE

(75) Inventors: Shou Yen Chou, Hsin-Chu (TW); Jaw Jung Shin, Hsin-Chu (TW); Tsai Sheng Gau, Hsin-Chu (TW); Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 138 days.

(21) Appl. No.: 11/193,133

(22) Filed: Jul. 29, 2005

(65) Prior Publication Data

US 2007/0028206 A1    Feb. 1, 2007

(51) Int. Cl.
*G06F 17/50* (2006.01)
(52) U.S. Cl. .......................... 716/21; 716/19
(58) Field of Classification Search ............... 716/21, 716/19, 5, 6
See application file for complete search history.

(56) References Cited

U.S. PATENT DOCUMENTS

| | | | |
|---|---|---|---|
| 5,326,659 A * | 7/1994 | Liu et al. ................ | 430/5 |
| 6,180,290 B1 | 1/2001 | Hsu et al. | |
| 6,664,011 B2 | 12/2003 | Lin et al. | |
| 6,711,732 B1 | 3/2004 | Dai et al. | |

FOREIGN PATENT DOCUMENTS

JP    2000243694 A * 9/2000

OTHER PUBLICATIONS

Haruki, Tamae, et al., "MASCOT: Mask Pattern Correction Tool Using Genetic Algorithm", Japanese Journal of Applied Physics, vol. 35, Dec. 1996, pp. 6374-6378.
Rosenbluth, Alan E. et al., "Optimum Mask and Source Patterns to Print a Given Shape", Journal of Microlithography, Microfabrication, and Microsystems, vol. 1, Apr. 2002, pp. 13-30.

* cited by examiner

*Primary Examiner*—Sun James Lin
(74) *Attorney, Agent, or Firm*—Haynes and Boone, LLP

(57) ABSTRACT

Disclosed are a system and method for designing a mask layout. In one example, the method includes representing the mask layout using a plurality of pixels, each having a mask transmittance coefficient. A control parameter is initialized and a representative of the mask layout is generated. The method determines acceptance of the representative of the mask layout by a cost function and a Boltzmann factor, where the cost function is related to the mask layout and a target substrate pattern, and the Boltzmann factor is related to the cost function and the control parameter. The methods repeats the steps of generating the representative and determining acceptance until the mask layout is stabilized. The control parameter is decreased according to an annealing schedule. The generating, determining, repeating, and decreasing steps are reiterated until the mask layout is optimized.

30 Claims, 10 Drawing Sheets

LAYOUT GENERATION AND OPTIMIZATION TO IMPROVE PHOTOLITHOGRAPHIC PERFORMANCE

BACKGROUND

The present disclosure relates generally to photolithography, such as is used in the manufacture of semiconductor integrated circuits.

Photolithography is a mechanism by which a pattern on a mask is projected onto a substrate such as a semiconductor wafer. In areas such as semiconductor photolithography, it has become necessary to create images on the semiconductor wafer that incorporate minimum feature sizes under a resolution limit. The mask pattern needs to be optimized for producing the image with as little distortion as possible.

Often, diffraction from a mask and a lithography system causes imaging distortion and degradation. For example, a square corner on the mask may be imaged as a round corner on the semiconductor wafer. To address this problem, many semiconductor photolithography systems use optical proximity correction (OPC) techniques and software in an attempt to optimize the existing mask pattern on a segment-by-segment, edge-by-edge, and/or polygon-by-polygon manner. However, the pattern layout optimization and correction by OPC software lacks optimization freedom and may be easily trapped into a local minimum prior to full optimization. Furthermnore, the OPC software is pattern specific.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates to the field of optical or photolithography. To illustrate the disclosure, several specific examples and configurations of systems, formulas, and patterns, and substrates are illustrated and discussed. It is understood, however, that these specific examples are only provided to teach the broader inventive concept, and one of ordinary skill in the art can easily apply the teachings of the present disclosure to other related areas.

Figure 1:
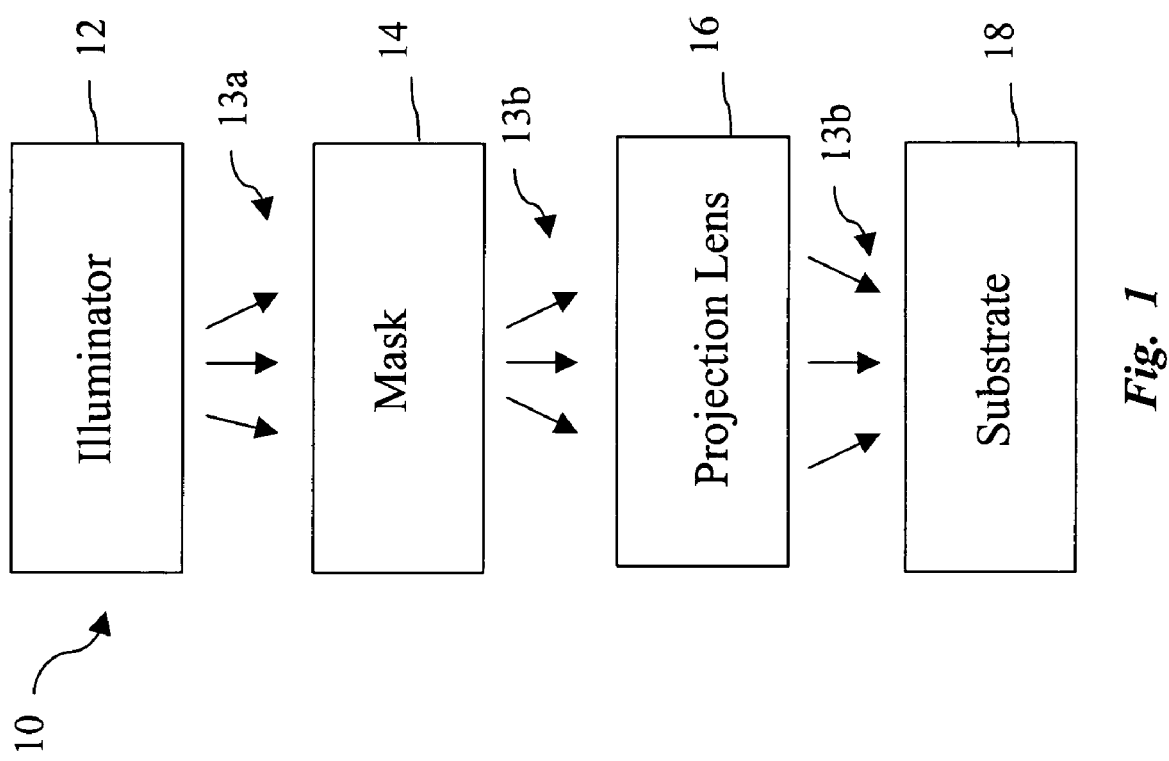
FIG. 1 is a block diagram of a semiconductor photolithographic system for implementing one or more embodiments of the present invention.

Referring now to FIG. 1, a semiconductor photolithographic system 10 is an example of a system that can benefit from one or more embodiments of the present invention. In the present embodiment, the semiconductor photolithographic system 10 includes an illuminator 12 which produces radiation energy or light 13a. Although the light 13a is shown as non-collimated, it is understood that other embodiments may utilize a collimated beam of light.

The illuminator 12 may further comprise a radiation source and a condenser (or an illumination system). The radiation source may be a suitable light source. For example, the radiation source may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a wavelength below approximately 100 nm. The condenser may comprise a single lens or a lens module having multiple lenses and/or other lens components designed to aid in directing the light 13a.

The light 13a is projected through (or onto) a patterning structure such as a reticle or photomask (collectively referred to as a mask) 14. Once the light 13a passes through the mask, it will be diffracted into various diffraction orders of lights 13b with different diffraction angles. The mask 14 may comprise a transparent substrate and an absorption layer. The transparent substrate may use fused silica ($SiO_2$), calcium fluoride, or other suitable material. The absorption layer may be formed using a plurality of processes and materials, such as depositing a metal film made with chromium (Cr) and iron oxide, or an inorganic film made with MoSi, ZrSiO, SiN, and/or TiN. The absorption layer may be patterned to have one or more openings where light may travel through without being absorbed and have one or more absorption areas where light may be completely or partially blocked.

A projection lens (objective lens or an imaging module) 16 collects the diffraction lights 13b and then redirect them onto a substrate 18 to form a pattern image. The projection lens 16 is representative of many different optical elements which may be positioned throughout the semiconductor photolithographic system 10, such as one or more lenses configured to project the patterned image 13b onto the substrate.

The substrate 18 may be a semiconductor wafer comprising an elementary semiconductor, a compound semiconductor, an alloy semiconductor, or any combination thereof. The substrate 18 may have a photoresist layer coated thereon during a photolithography process. The substrate 18 may be positioned on a substrate stage capable of moving in translational and rotational modes such that the substrate 18 may be aligned for patterning superposition.

Masks may carry information of designed patterns (mask pattern or mask layout) to be transferred to the substrate during a photolithography process. Masks may be of various types associated with different technologies. For example, a mask may be a binary mask where each location of the mask may have a transparency of 1 (completely transparent) or 0 (completely opaque using chromium coating). Optical proximity correction (OPC) technology may use a binary mask having a to-be-transferred pattern plus various assisting features to overcome a distortion effect, referred to as optical proximity error. Phase shift mask (PSM) technology has two categories: attenuated phase-shift mask (AttPSM) and alternating phase-shift mask (AltPSM). AttPSM masks may have coating areas that are partially transparent. AltPSM masks may have alternating chrome areas and 180 degree phase-shifted transparent areas. Mask pattern design is a complex process with involvement of these technologies. The present disclosure provides a method and a system to generate and optimize a mask pattern for enhanced and improved photolithographic performance.

Figure 2:
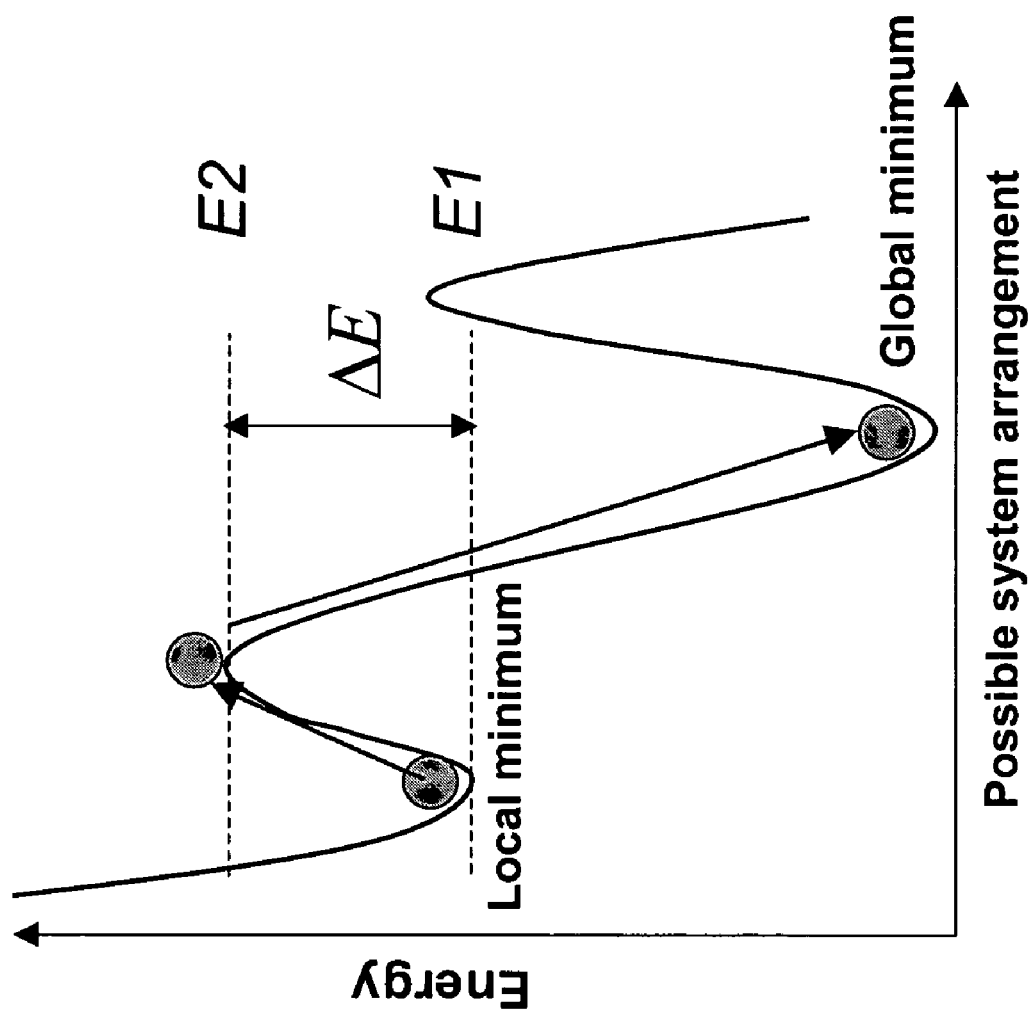
FIG. 2 is a schematic view of an energy system illustrating the design and optimization of a mask layout using a simulated annealing process.

FIG. 2 is a schematic view of an energy system 20 illustrating the design and optimization of a mask layout using a simulated annealing (SA) process. The SA process utilizes an analog between the annealing process and the search for a minimum in a more general system.

The SA process is a generalization of a Monte Carlo method for examining the equations of state and frozen states of n-body systems. The concept is based on the manner in which liquids freeze or metals recrystallize in an annealing process. In an annealing process a metal, initially at high temperature and disordered, is slowly cooled so that the system at any time is approximately in thermodynamic equilibrium. As cooling proceeds, the system becomes more ordered and approaches a "frozen" ground state at T=0. If the initial temperature of the system is too low or cooling occurs to quickly, the system may become quenched, forming defects or freezing out in metastable states (i.e., trapped in a local minimum energy state).

The SA process mimics this natural process based on the use of statistical mechanics to establish thermal equilibrium in a collection of atoms. In a SA process, an initial state of a thermodynamic system was chosen at a temperature T. Holding T constant, the initial state is perturbed and the change in energy is computed. If the change in energy dE is negative, the new configuration is accepted. If the change in energy is positive, it is accepted with a probability given by the Boltzmann factor $\exp-(dE/T)$. This process is then repeated a sufficient number of times to obtain good sampling statistics for the current temperature, and then the temperature is decremented and the entire process repeated until a ground state (or frozen state) is achieved at T=0.

A mask can be divided into a plurality of pixels (e.g., an array of pixels). Each pixel can stay in one of a few allowed mask states similar to numerable quantum states of an atom. The array of pixels each having a mask state can represent a mask layout. The array of pixels is analogous to a collection of molecules with a finite number of possible states.

By analogy, the current state of the thermodynamic system is analogous to the current solution to the combinatorial problem (more specifically, a current mask layout), the energy for the thermodynamic system is analogous to an objective function, and the ground state is analogous to a global minimum.

Optimizing the mask pattern is similar to optimizing the relative positions of molecules so that energy of the system can be minimized. The SA process has the advantage of being able to migrate through a sequence of local extrema in search of the global solution and to recognize when the global extremum has been located. Thus, the design and optimization of a mask layout may be accomplished by a method and system using the SA process.

Figure 3:
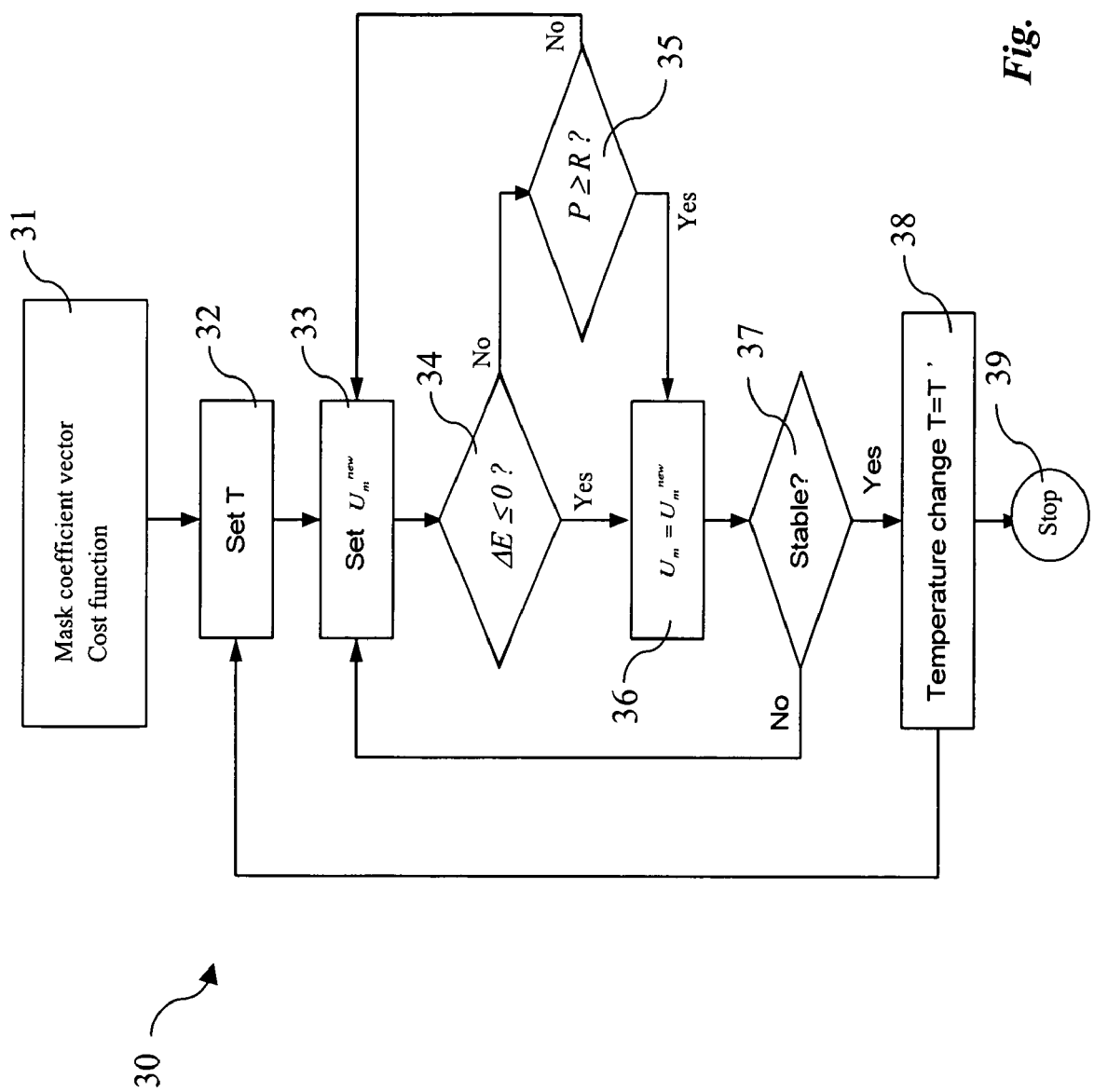
FIG. 3 is a flow chart of one embodiment of a method of generating and optimizing a mask pattern according to the aspects of the present disclosure.

FIG. 3 is a flow chart illustrating a method 30 that may be used to generate and optimize a mask pattern. The method 30 is described with additional reference to FIGS. 4a, 4b, 5, 6, and 7.

Figure 4A:
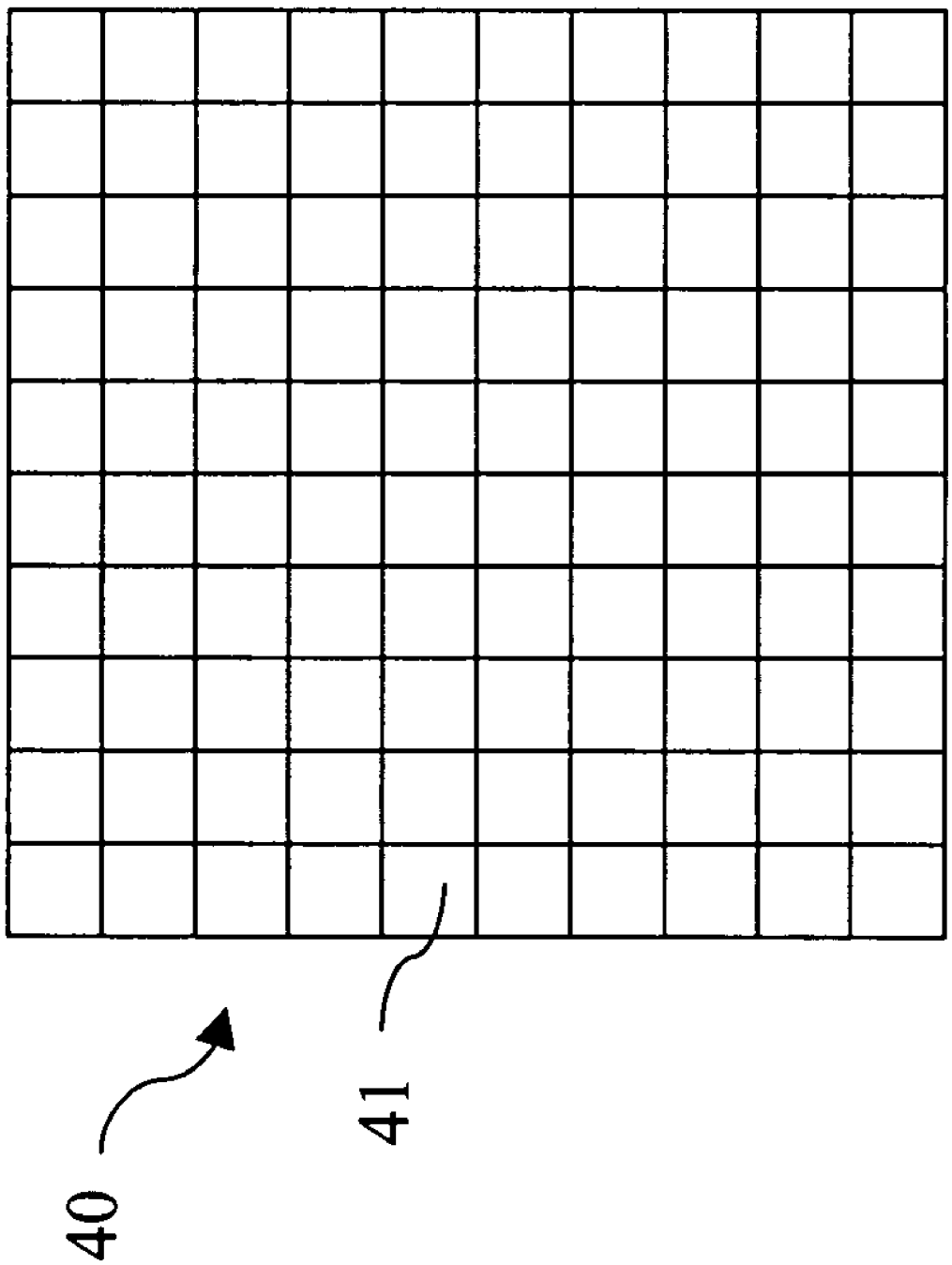
FIGS. 4a and 4b are schematic views of embodiments of a matrix representing a mask pattern according to the aspects of the present disclosure.

The method 30 begins at step 31 where a mask pattern is defined and mask states and a cost function are defined for the mask pattern. A mask can be divided into a plurality of pixels, with each pixel having a set of predefined allowable states. A mask pattern defined by an array of pixels may have a constant pixel size. With additional reference to FIG. 4a, illustrated as a schematic view of a representative of a mask pattern 40, the mask pattern is represented by a matrix comprising a plurality of regular pixels having a constant pixel size. First, the mask space is divided into multiple small areas, each of which is referred to as a mask pixel. As an example, a pixel 41 is an exemplary pixel. Although square pixels are used in the present example, it is understood that the pixel geometry may be defined in other shapes, including rectangles. The pixel dimension may be chosen to be not less than a minimum feature size that a mask writer is capable of producing. The pixel size relates to effectiveness and efficiency of the SA simulation. If the pixel size is too small (less than the minimum feature size), it is beyond the capability of the mask writer and costs more simulation time without any real improvement in mask pattern optimization. On the other hand, coarse mask pixels are not capable of taking full advantage of the mask writer and may not approach the "actual" optimal mask pattern because of the intrinsically poor resolution induced by large pixel size.

Figure 4B:
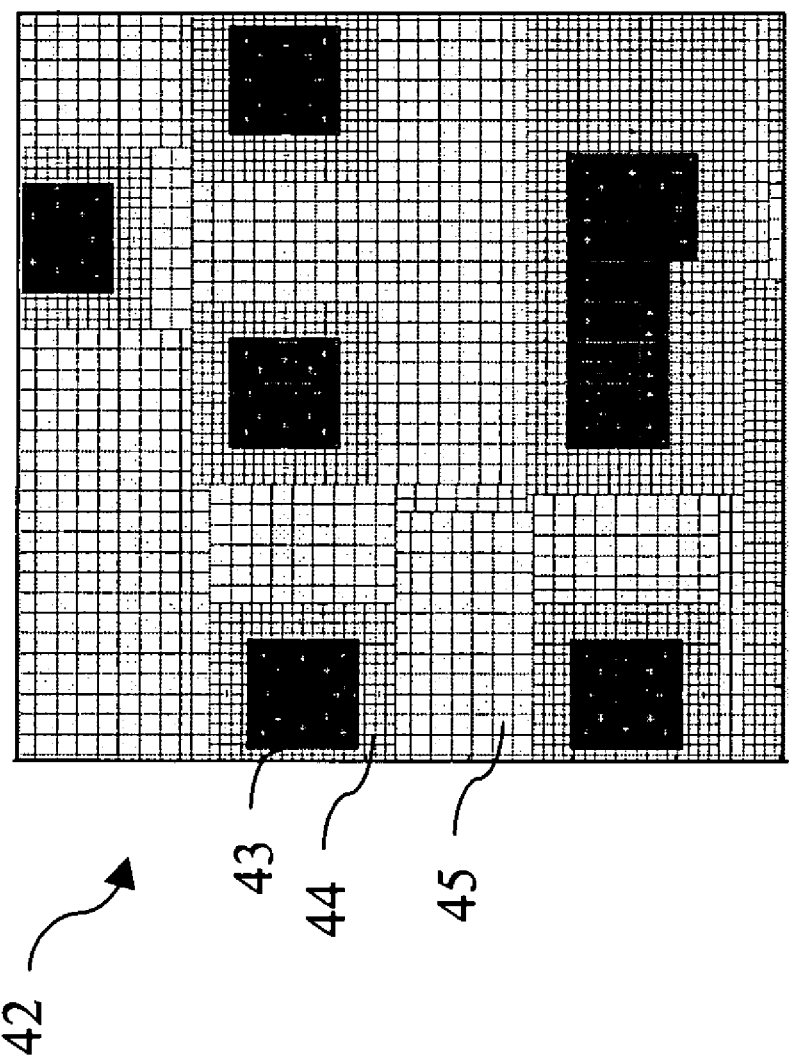

A mask pattern defined by an array of pixels may have a variable pixel size. The variable pixel size method may define various mask pixel sizes to utilize both high pattern resolution and high simulation efficiency. FIG. 4b illustrates an exemplary mask pattern 42 formed using a variable pixel size method. The mask pattern 42 may comprise exemplary pixels 43, 44, and 45 each having a different pixel size. As an example to realize a mask pattern having variable pixel size, the variable pixel size method may first define a minimum pixel size, and then automatically decompose the mask space into several rectangular regions based on a target substrate pattern. The target substrate pattern is defined as an expected pattern to be formed on a substrate from a mask layout. A pixel may be defined to have a smaller pixel size if it is close to an edge of the target pattern and a larger pixel size if it is far away from the pattern edge. This process may be employed to generate a pixel matrix for an optical proximity correction mask so that a mask region near edges of the target pattern may have the finest pixel resolution, which provides for more efficient design and optimization of mask patterns to incorporate assistant features.

Each pixel is represented by its transmittance and phase, both being constant within the pixel. When a radiation beam (or radiation energy such as a light beam) transmits through a pixel of the mask, the amplitude and phase of the beam is altered according to the transmittance and phase of the pixel. A mask transmission coefficient can be employed to incorporate transmittance (t) and phase (θ) by the following formula: mask transmission coefficient $U_m = \sqrt{t}e^{i\theta} = Ae^{i\theta}$, where 'A' is wave amplitude transmittance. The mask transmittance coefficient of the $i^{th}$ pixel is referred to as $U_{m,i}$. All $U_{m,i}$ elements in a mask pattern form a mask coefficient vector $U_m$:

$$U_m = [U_{m,1} \; U_{m,2} \ldots U_{m,L}] \quad (1)$$

A mask coefficient vector $U_m$ represents a mask pattern and can be employed in mask design and optimization using a SA method.

In the above example, a mask transmission coefficient may only be in a limited number of discrete states. The value of $U_{m,i}$ may be restricted within a possible mask state vector $S_m$ with n elements.

$$S_m = [S_{m,1}\ S_{m,2}\ ..\ S_{m,n}] = [A_1 e^{i\theta_1}\ A_2 e^{i\theta_2}\ ..\ A_n e^{i\theta_n}] \quad (2)$$

As a simple example, the transmittance may have two allowed values 0 and 1 while the phase may only take a single value 0. Thus the mask state vector is [1, 0]. This may present a binary mask having transparent areas of 100% transmittance and chromium coating area of 0% transmittance. In another example, the transmittance may have two allowed values 0 and 1 while the phase may have allowed values 0 and Pi. Combining above transmittance and phase can give allowed mask states as −1 (transparent and 180 degree phase shift), 0 (absorbing areas), or 1 (transparent and no phase shift). Thus the mask state vector is [1, 0, −1]. For the sake of example, a simplified 3×3 pixel matrix is provided below with example values of mask states for a starting arrangement of the mask array ($U_m$):

| | | |
|---|---|---|
| 0 | 1 | 1 |
| 0 | 1 | −1 |
| 1 | −1 | 0 |

In another example, the transmittance may have transmittance states such as 0, 0.2, 0.4, 0.6, 0.8, and 1.0, while the phase may have phase states such as 0, Pi/4, Pi/2, 3Pi/4, and Pi. The transmittance and phase may be defined to have customer-specific mask states to reflect real mask technologies such as binary mask, PSM, and other future mask technologies. A mask pattern represented by a mask coefficient vector $U_m$ may be directly used for tapeout or may be alternatively converted into a polygon pattern or other proper format for tapeout.

The purpose of mask optimization is to find a suitable mask coefficient vector $U_m$ for the "best" lithographic performance. (It is understood that "best" is a relative term that may depend on one or more factors desired for a particular mask). A cost function (or an objective function) is defined as an indicator of the optimization performance and is thus constructed to evaluate the photolithographic performance of the mask pattern, comparable to a total energy of an annealing system. The cost function may be defined as a measure of an overall discrepancy between a target substrate pattern and a substrate image formed from a mask pattern. The SA process is heuristic since it requires numerous iterations to mimic an annealing process. After numerous iterations of SA process, each mask pixel will settle on an optimal mask state, leading to a minimized cost function, an optimized mask pattern, and optimized photolithographic performance.

Figure 5:
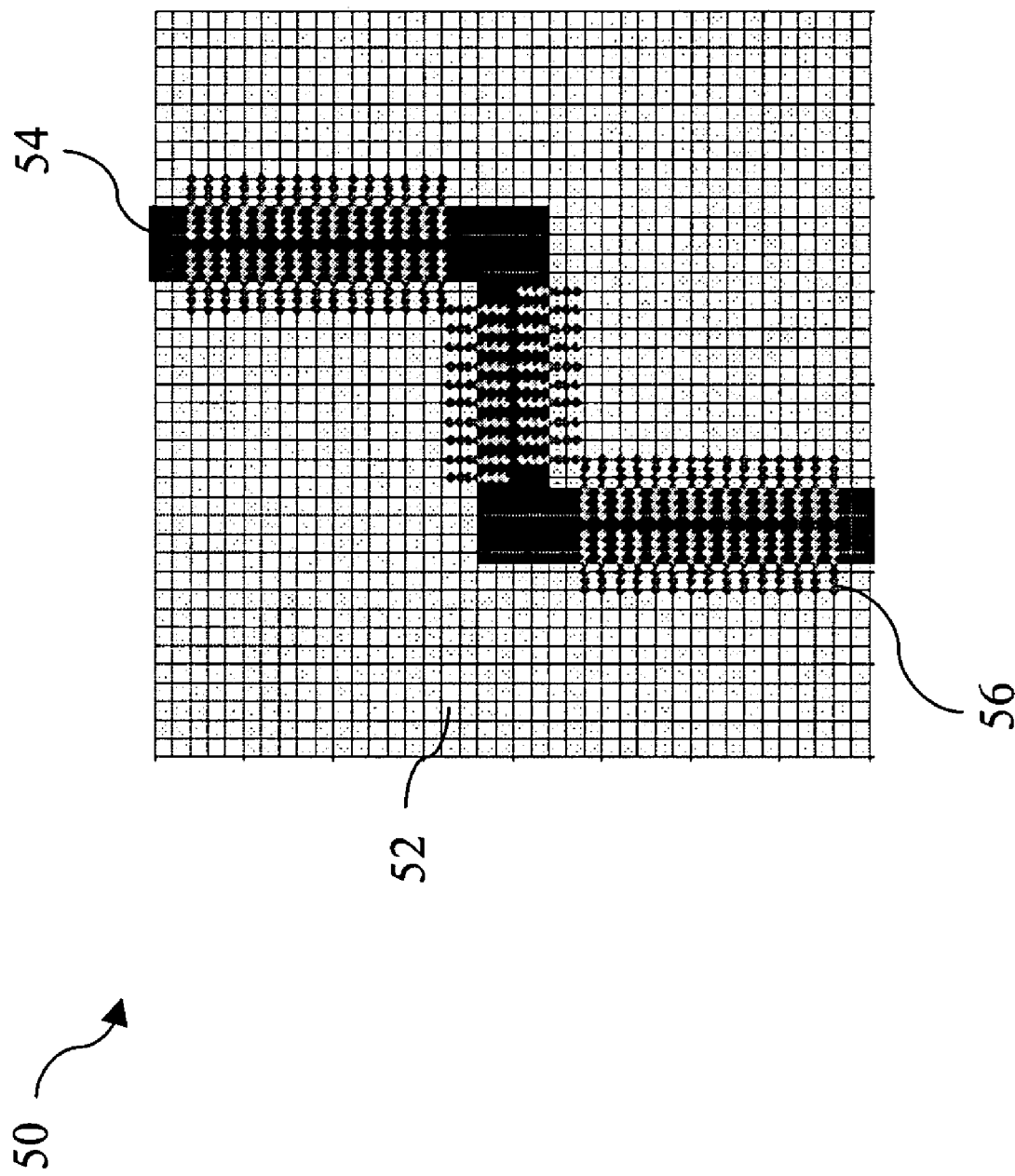
FIG. 5 is a schematic view of a substrate pattern and associated control points according to the aspects of the present disclosure.

As an example, the cost function may be defined as a summation of a discrepancy function over all locations on the substrate. In consideration of simulation efficiency, the cost function may be alternatively constructed as a summation of the discrepancy function over selected points on the substrate in which these selected points may be configured in more sensitive areas such as around edges (or contour) of the target pattern. These selected points are referred to as control points. The control points may be further assigned different weights. Unselected locations can be treated as control points with zero weight. FIG. 5 illustrates an example of a substrate 50, having a plurality of control points 56 constructed around the edges of the target pattern 54 on a substrate mesh 52. Each control point may have two associated properties, reference intensity ($I_{ref}$) and weighting parameter (w). The reference intensity ($I_{ref}$) represents an intensity of the target substrate pattern at a control point. The weighting parameter is the weighting coefficient of the control point, which indicates the importance of the control point in the optimization problem.

The above described approach serves only as an example of constructing a cost function having a higher efficiency during the simulation. As a more specific example, the cost function in the method 30 may be defined as follows:

$$E = \sum_{j=1}^{M} w_j \cdot (I_{C,j} - I_{ref,j})^2 \quad (3)$$

where j is the index of control points and $L_{c,j}$ is an image intensity of $j^{th}$ control point where the image is formed from a mask pattern. The summation is over all control points with relative weightings $w_j$.

Selection of control points and weighting parameters may be based on predefined rules aimed for high efficiency and effectiveness. For example, the weighting parameter may be zero if the distance of a control point to the edges of a targeted pattern is beyond a predefined length.

Referring again specifically to FIG. 3, in step 31, a mask coefficient vector is defined to represent a mask pattern. A mask state vector is defined for allowed mask transmittance coefficients. A cost function is defined to be a function of image intensity over control points on a substrate. Control points may also be defined according to the target substrate pattern on the substrate. Other initialization processes may also be performed at this step.

After the initialization process described at step 31, the method 30 of FIG. 3 proceeds to step 32, where a temperature T is provided for the SA simulation. The temperature change during the annealing simulation may be given by an annealing schedule defined in step 38. When the step 32 is first executed, an initial temperature value T is provided. The temperature is used as a parameter to control the simulated annealing process. The lower the initial temperature is, the quicker the method 30 takes to reach a final solution. The higher the initial temperature is, the higher the probability P is for the system to reach a global minimum. If the initial temperature is too low, then the optimization of the mask pattern may have a higher chance of being trapped to a local minimum. Choosing an initial temperature may depend on various factors such as simulation time and optimization requirements.

For example, the initial temperature may be given as $T_0 = -[E(U_m^a)]/\ln(\chi_0)$, where $\chi_0$ is an acceptance probability having a value below 1 (such as 0.7), and $[E(U_m^a)]$ is a cost function of a mask coefficient vector $U_m^a$. $U_m^a$ may be an initial mask coefficient vector randomly produced as described next with respect to step 33. $U_m^a$ may be a mask coefficient vector constructed according to the target substrate pattern. In another example, $U_m^a$ is an average of several mask coefficient vectors randomly produced. In a further example, the initial temperature may be defined through a different formula such as $T_0 = a*[-E(U_m^a)]/\ln(\chi_0)$, where "a" is a constant such as 0.5. Alternatively, the initial temperature may be provided by an user according to a mask technology, target substrate pattern, and mask workshop technologies.

The method 30 proceeds to step 33 in which a new mask coefficient vector or a first mask coefficient vector $U_m$ is generated. A mask coefficient vector comprises an array of mask transmittance coefficients that each correspond to a pixel in the mask. A mask transmittance coefficient may take one of the allowed states defined by the mask state vector $S_m$ in equation (2).

A new mask coefficient vector may be randomly generated to mimic an actual annealing process. For example, the generation of a new mask coefficient vector may need to introduce small random changes and allow all possible solutions to be reached. In a simple example, $U_m^{new}=[U_m+u]$, wherein $U_m^{new}$ and $U_m$ are newly-produced and current mask coefficient vectors, respectively. u is a vector corresponding to change of the mask coefficient vector and is randomly produced according to the mask state vector. The symbol "[. . ]" may present a modular operation such that $U_m^{new}$ is always one of the allowed mask states defined in the mask state vector.

As another example of generating a new mask coefficient vector, one of the mask pixels is randomly selected (such as the $i^{th}$ pixel) and its mask state is replaced by a new mask state $U_{m,i}^{new}$ that may differ from the original $U_{m,i}$ while the other pixels remain unchanged. The method 30 may randomly select an element $U_{m,i}^{new}$ from the mask state vector $S_m$. Alternatively, more than one mask pixel may be chosen and their mask states updated. The new mask coefficient vector $U_m^{new}$ is a small-perturbed version of the original mask coefficient vector $U_m$ which has the form:

$$U_m^{new}=[U_{m,1}\ U_{m,2}\ ..\ U_{m,i}^{new}\ .\ U_{m,L}] \quad (4)$$

When the step 33 is first executed, an initial mask coefficient vector may also be randomly produced wherein every pixel is initialized with a mask state randomly selected from the mask state vector. It is not necessarily to use the target substrate pattern to construct the initial mask coefficient vector. The target substrate pattern may even be eliminated from the initial mask coefficient vector such that the mask coefficient vector may have less chance to be trapped in a local minimum.

The method 30 may proceed to step 34 wherein the cost function variation $\Delta E$ is calculated. The cost function variation $\Delta E$ corresponds to mask pattern variance from $U_m$ to $U_m^{new}$ and is defined as $$\Delta E=E(U_m^{new})-E(U_m) \quad (5)$$

Since $U_m^{new}$ and $U_m$ only differs in the mask state of the selected mask pixel $U_{m,i}$ (or a set of selected mask pixels in another example), the new cost function $E(U_m^{new})$ may be quickly calculated by adding the "influence" of the new mask pixel $U_{m,i}^{new}$ to the old cost function $E(U_m)$. The cost function is determined by the difference between a substrate image converted from a mask pattern and the target substrate pattern (e.g., such as is defined by equation (1)). The substrate image is obtained from a mask pattern by imaging the mask pattern or both imaging the mask pattern and developing a layer of photoresist on the substrate. A procedure to complete the conversion from the mask pattern to the substrate image may involve simulating imaging and developing.

An example of simulating imaging is now described. An aerial image can be expressed as an image intensity function over a substrate location (such as x and y, or over control points). The aerial image of the mask pattern through a lithography system may be related to a lens transfer function. The lens transfer function refers to the pupil function of the projection lens system. The pupil function describes the light collection capability of the system. The projection lens system collects the light emitting from the objects (mask) and redirects them to the image plane (substrate plane) to form an image. A projection lens system may be composed of several lens elements to achieve maximum field size with minimum aberrations. Instead of considering the details of the lens configuration, the projection lens can be treated using a pupil function to simplify the analysis of the imaging behavior. An example of the pupil function is 1 if r<=NA or 0 if r>NA. NA is a constant and indicates the maximum angle of the diffracted light to the optical axis that can be collected by the lens system.

For a coherent system, the object is illuminated by a point source with an infinitely small dimension. The image intensity distribution that arises from a point source s may be described mathematically as:

$$I_s(x,y) = \left| \int_{-\infty}^{+\infty} \int P(f,g) M(f-f_s, g-g_s) e^{-i2\pi[fx+gy]} df dg \right|^2 \quad (6)$$

where P is the pupil function, M is the Fourier transform of the mask function m, and $f_s$ and $g_s$ represent the angle of the incident light ray.

A wafer stepper/scanner adopts partially coherent illumination by a source of finite extent because a point source with an infinitely small dimension implies zero illumination power. The partially coherent image is the incoherent sum of coherent images by all points in the light source. The partially coherent image intensity can be expressed as:

$$I(x,y) = \frac{\sum_s a_s I_s(x,y)}{\sum_s a_s} \quad (7)$$

where $a_s$ is the strength of the source s. Combining equation (6) and equation (7), imaging with partially coherent light can be reformulated as $$I(x,y) = \iiint_{-\infty}^{+\infty} \iiint J(f,g) P(f+f', g+g') P^* \quad (8)$$
$$(f+f'', g+g'') \cdot M(f', g') M^*(f'', g'')$$
$$e^{-i2\pi[(f'-f'')x+(g'-g'')y]} df dg df' dg' df'' dg''$$

where J is the effective source function that describes the distribution of illumination light rays in terms of their incidentangle onto the mask. Equation (8) indicates that the image is formed by adding the interference between pairs of waves traveling with angles corresponding to (f', g') and (f'', g''). The interaction between each pair is weighed by a factor known as a transmission cross-coefficient (TCC) function:

$$TCC(f',g';f'',g'') = \int_{-\infty}^{\infty} \int J(f,g) P(f+f', g+g') \quad (9)$$

-continued
$$P^*(f+f'', g+g'')df\,dg$$

such that $$I(x,y) = \int\int\int_{-\infty}^{+\infty}\int\int TCC(f',g';f'',g'') \quad (10)$$
$$M(f',g')M^*(f'',g'')\cdot$$
$$e^{-i2\pi[(f'-f'')x+(g'-g'')y]}df'\,dg'\,df''\,dg''$$

The above equation may be further modified to $$I(x,y) = \sum_{k=1}^{\infty} \alpha_k |\phi_k(x,y) \otimes m(x,y)|^2 \quad (11)$$

where $\otimes$ is the convolution operation, m is the mask function, and $\phi_i$ is the Fourier transform of an eigenvector $\Phi_i$ of the TCC function and is generally referred to as a convolution kernel of the partially coherent image system.

As discussed above, the interested mask region can be divided into a pixel array having L mask pixels. The mask function m for the mask pixel array could be expressed as $$m(x,y) = \sum_{i=1}^{L} m_i(x,y) = \sum_{i=1}^{L} U_{m,i} \cdot \prod_i(x,y), \quad (12)$$

where $m_i$ is the mask function of ith mask pixel, $U_{m,i}$ is the mask transmission coefficient of the ith mask pixel as mentioned above, and $\Pi_i$ is the ith pixel function that has a form defined as:

$$\prod_i(x,y) = \begin{cases} 1, & x_{i,1} \leq x \leq x_{i,2} \text{ and } y_{i,1} \leq y \leq y_{i,2} \\ 0, & \text{otherwise} \end{cases} \quad (13)$$

Combining equations 3 and 11-13, the cost function relative to a mask pattern defined by the mask coefficient vector $U_m$ in equation (1), the cost function may be expressed as $$E(U_m) = \sum_{j=1}^{M} w_j \cdot \left( \sum_{k=1}^{N} \left| \sum_{i=1}^{L} U_{m,i} \cdot \left[ \sqrt{\alpha_k}\, \phi_k(x_{C,j}, y_{C,j}) \otimes \prod_i(x_{C,j}, y_{C,j}) \right] \right|^2 - I_{ref,j} \right)^2 \quad (14)$$

The cost function E in equation (14) may be further expressed as $$E(U_m) = \sum_{j=1}^{M} w_j \cdot \left( \sum_{k=1}^{N} \left| \sum_{i=1}^{L} U_{m,i} \cdot D(i,j,k) \right|^2 - I_{ref,j} \right)^2 \quad (15)$$

and $$D(i,j,k) = \sqrt{\alpha_k}\, \phi_k(x_{C,j}, y_{C,j}) \otimes \prod_i(x_{C,j}, y_{C,j}). \quad (16)$$

The convolution term $$\sqrt{\alpha_k}\, \phi_k(x_{C,j}, y_{C,j}) \otimes \prod_i(x_{C,j}, y_{C,j})$$

represents the influence of a mask pixel $m_i$ from a kernel $\phi_k$ on the image intensity of the control point $C_j$. As discussed above, the mask pixel functions $\Pi_i$ are defined in equation (13). The kernel functions $\phi_k$ represent a lithography system including its light source, lens system, and configuration thereof. To a given lithography system, the kernel functions $\phi_k$ are given and may remain unchanged. In the SA iterations, the only variable is the mask coefficient vector $U_m$, which represents a mask pattern. Therefore, before the SA iteration begins, all the possible combinations of the convolution terms $$\sqrt{\alpha_k}\, \phi_k(x_{C,j}, y_{C,j}) \otimes \prod_i(x_{C,j}, y_{C,j})$$

may be pre-calculated and the results may be stored in an M×N×L matrix D for use, thus saving the computation time during the SA mask optimization. With the pre-calculated data matrix D, the new cost function can be efficiently calculated and the iteration time in the SA process can be significantly reduced.

The calculation of the convolution term can be implemented using a lookup table method. A kernel function can be sampled into a kernel matrix and is stored in a lookup table. Such lookup table can be used to facilitate the calculation of the data matrix D.

Figure 6:
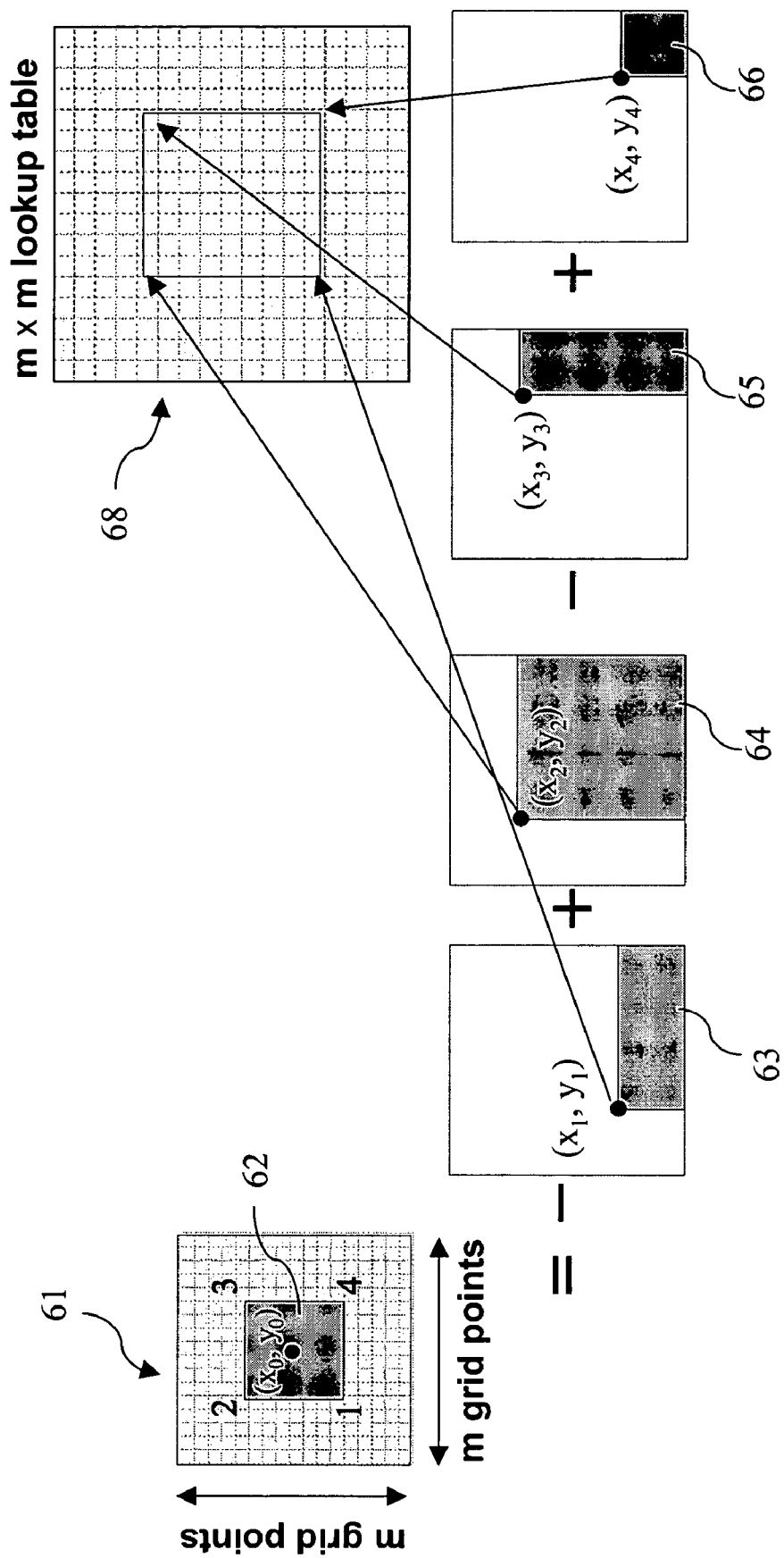
FIG. 6 is a diagram illustrating the use of a lookup table to identify precalculated values.

Referring to FIG. 6, provided is an example of how the lookup table method may be utilized. A lookup table is a data structure used to store pre-calculated data. The convolution kernel $\phi_j$ may be sampled to form a discrete data array. The radius of the sampling region is referred to as proximity range (or ambit) of the convolution kernel and the sampling frequency is called the grid size, as shown in a matrix 61 of FIG. 6. The mask may have a rectangular pattern 62 defined by four corners labeled as 1 $(x_1, y_1)$, 2 $(x_2, y_2)$, 3 $(x_3, y_3)$, and 4 $(x_4, y_4)$. The image intensity on a substrate point $(x_0, y_0)$ from the mask pattern 62 by the convolution kernel $\phi_k$ may be extracted from the image intensity of the four mask patterns 63, 64, 65, and 66 by performing lookups in a lookup table 68 for the four corners $(x_1, y_1)$, $(x_2, y_2)$, $(x_3, y_3)$, and $(x_4, y_4)$.

An image intensity I $(x_0, y_0)$ at the substrate location $(x_0, y_0)$ from the square mask pattern 62 by a convolution kernel $\phi_j$ may equal to a summation of the following four terms $$I(x_0, y_0) = -I(x_1, y_1) + I(x_2, y_2) - I(x_3, y_3) + I(x_4, y_4) \quad (17)$$

where I ($x_1$, $y_1$) is an image intensity at the substrate location ($x_1$, $y_1$) from the square mask pattern 63 by the same convolution kernel $\phi_j$; I($x_2$, $y_2$) is an image intensity at the substrate location ($x_2$, $y_2$) from the square mask pattern 64 by the convolution kernel $\phi_j$; I ($x_3$, $y_3$) is an image intensity at the substrate location ($x_3$, $y_3$) from the square mask pattern 65 by the convolution kernel $\phi_j$; and I($x_4$, $y_4$) is an image intensity at the substrate location ($x_4$, $y_4$) from the square mask pattern 66 by the convolution kernel $\phi_j$. Each term can be obtained from the lookup table 68 comprising m×m terms. A general mask pattern may be decomposed into a plurality of rectangles, each of which can be obtained using the lookup table method.

If one or more of the points ($x_1$, $y_1$), ($x_2$, $y_2$), ($x_3$, $y_3$), and/or ($x_4$, $y_4$) are not grid points and so can not be identified from the lookup table, a bilinear interpolation or another interpolation method may be used to find a corresponding value. For example, if (x, y) is not a grid point and is within an area defined by four grid points [($x_n$, $y_n$), ($x_n$, $y_{n+1}$), ($x_{n+1}$, $y_{n+1}$), ($x_{n+1}$, $y_n$)], then a corresponding value of (x, y) may be given by the following formula:

$$f(x, y) = f(x_N, y_N) \times (x_{N+1} - x) \times (y_{N+1} - y) + \quad (18)$$
$$f(x_{N+1}, y_N) \times (x - x_N) \times (y_{N+1} - y) +$$
$$f(x_N, y_{N+1}) \times (x_{N+1} - x) \times (y - y_N) +$$
$$f(x_{N+1}, y_{N+1}) \times (x - x_N) \times (y - y_N)$$

where f($x_n$, $y_n$), f($x_n$, $y_{n+1}$), f($x_{n+1}$, $y_{n+1}$), and f($x_{n+1}$, $y_n$) can be directly found from the lookup table. The lookup table 68 can be previously calculated. For example, the lookup table may be calculated at step 31. The lookup table may be calculated once the lithography system is given.

Thus, a cost function may be calculated using equation (3), in which the weighting parameter $w_j$ is defined at step 31. The reference intensity $I_{ref,j}$ at a control point j may be defined according to the target substrate pattern. The image intensity $I_{c,j}$ can be given by equation (11). To utilize a practical and efficient simulation, various methods may be utilized such as pre-calculated convolution terms stored in a data matrix and/or lookup tables.

Simulation of the developing of a layer of resist comprises a conversion from an image intensity to a resist pattern. The conversion may be related to a film interference function which comprises information of light intensity distribution after interference from the layer of resist. The layer of resist may comprise multi-layer films such as a top anti-reflective coating (TAR) film, a bottom anti-reflective coating film (BARC), and a resist film. The conversion may be related to a film resist response function having information of resist response to light. The response of the resist may include response to exposure intensity, exposure time, and response radius. The conversion may be related to a resist development function, reflecting the impact on the final resist pattern of the development process. The convolution terms may be modified to incorporate the conversion from an aerial image to a resist pattern and so the image intensity function may represent a resist pattern after an exposure and development process. A more general simulation of a mask pattern to a resist pattern may include both an imaging simulation and a developing simulation.

Referring again to FIG. 3, at step 34, the cost function of the new mask coefficient vector is compared with the cost function of the current mask coefficient vector. If the new cost function is less than or equal to the current one, the method 30 proceeds to step 36 where the new mask coefficient vector is accepted to replace the current mask coefficient vector. Otherwise, the method 30 proceeds to step 35 where the new mask coefficient vector may be accepted with a probability.

At step 35, the probability P is determined by the Boltzmann factor exp–($\Delta$E/T) where $\Delta E = E(U_m^{new}) - E(U_m)$. The acceptance may use a Monte Carlo method. For example, a random number R ranging from 0 to 1 is generated and compared with the probability P. If P>=R, then the mask state is accepted. Otherwise, it is rejected. When the new mask pattern is accepted, the method 30 moves to step 36. When the new mask pattern is rejected, the method 30 returns to step 33 to generate another mask pattern.

At step 36, the mask coefficient vector is updated using the formula $U_m = U_m^{new}$. Then the method 30 proceeds to step 37 where the cost function is evaluated. The method may repeat the iteration from step 33 to step 36 until the cost function is stabilized or a pre-defined iteration count is reached. The cost function is considered to be stabilized when the variation of |$\Delta$E| is less than a predefined criteria (such as 5%) of the initial value for each iteration.

The method 30 proceeds to step 38 where a new temperature may be produced. The temperature T may be decreased according to an annealing schedule during the simulated annealing process. The annealing schedule describes how the annealing temperature changes as iterations increase. It may contain annealing time, cooling rate, and the initial temperature. The annealing time indicates the number of iterations in SA process. The cooling rate describes how the annealing temperature changes with time. The initial temperature has been discussed and implemented at step 32.

In one example, the temperature as a function of annealing time can be defined as $$T(t) = T_0 e^{-R_c \cdot t} \quad (14)$$

where $R_c$ is cooling rate. In another example, the temperature as a function of annealing time is defined as $$T(t) = \frac{T_0}{1 + R_c \cdot t}. \quad (15)$$

Figure 7:
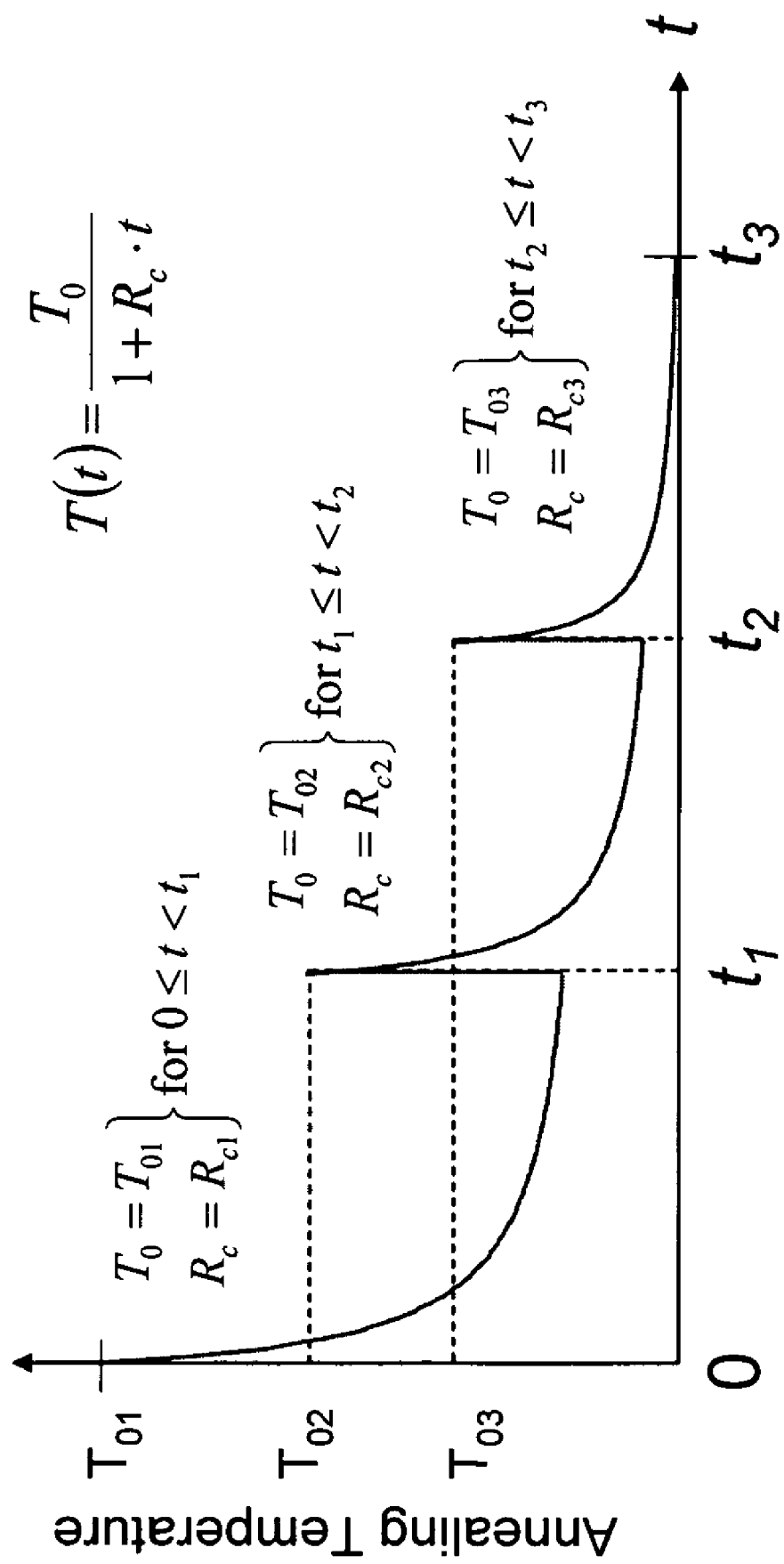
FIG. 7 is an exemplary chart of control parameter temperature as a function of time during a simulated annealing process.

A small cooling rate $R_c$ makes the cost function converge slowly, while a large cooling rate may result in the solution being trapped easily in a local minimum. A proper combination of annealing time, temperature, and cooling rate may aid in obtaining a better solution close to the global minimum. In another example, a multiple-staged annealing schedule may be used to achieve a better optimization result within reasonable iteration times. FIG. 7 shows an exemplary chart of the annealing schedule during a simulated annealing process. The annealing schedule may be modified by a user according to the optimization result and other factors.

The method 30 may then return to step 32 to set the new temperature as the current temperature or may return to step 33 if the new temperature is set up at step 38 to resume the SA iteration under the decreased temperature. The temperature and the cost function may also be evaluated during step 38.

The method 30 may stop at 39 when a certain condition is met. For example, it stops when a final temperature is reached. The final temperature may be a temperature close to zero and may be defined during the initialization process at step 31. Alternatively, the method 30 may stop if no further improvement is found in the iterative optimization. In another case, if the search ceases to make progress and the solution is in doubt of being trapped at a local minimum, then the SA simulation may raise the temperature and cool down in another annealing process. This re-annealing process may be initiated by a predefined criteria and rules, or alternatively by a user.

Thus, the above described method uses a mask coefficient vector (or an array of pixels) as a data structure of a mask pattern during designing and optimizing the mask pattern. Because the number of elements in the mask coefficient vector can be in the order of hundreds and thousands, the degree of freedom is so large that it is impractical to solve the optimization problem using a complete enumeration technique. Since the phase and transmittance distribution in a practical mask fabrication process are discrete, a simulated annealing (SA) method can be used to migrate through a sequence of local extrema in search of a global solution and to recognize when the global extremum has been located. Additionally, the number of trials required to find an optimal solution does not increase very rapidly with the dimensionality of the problem.

For the sake of further example, a final version of the optimized 3×3 pixel matrix is provided below with exemplary values of mask coefficients:

| -1 | -1 | -1 |
|----|----|----|
| -1 | 1  | -1 |
| -1 | -1 | -1 |

It is understood that although the above examples have shown a 3×3 array (above) and a 10×10 array (FIG. 4*a*), it is expected that some embodiments will have a much larger array (e.g., on the order of millions of pixels). In the present embodiment, the lookup table method may be used to calculate the image intensity of the cost function. Instead of the potential millions of multiplication operations discussed above, the image intensity can be determined by relatively simple table lookup operations.

Figure 8:
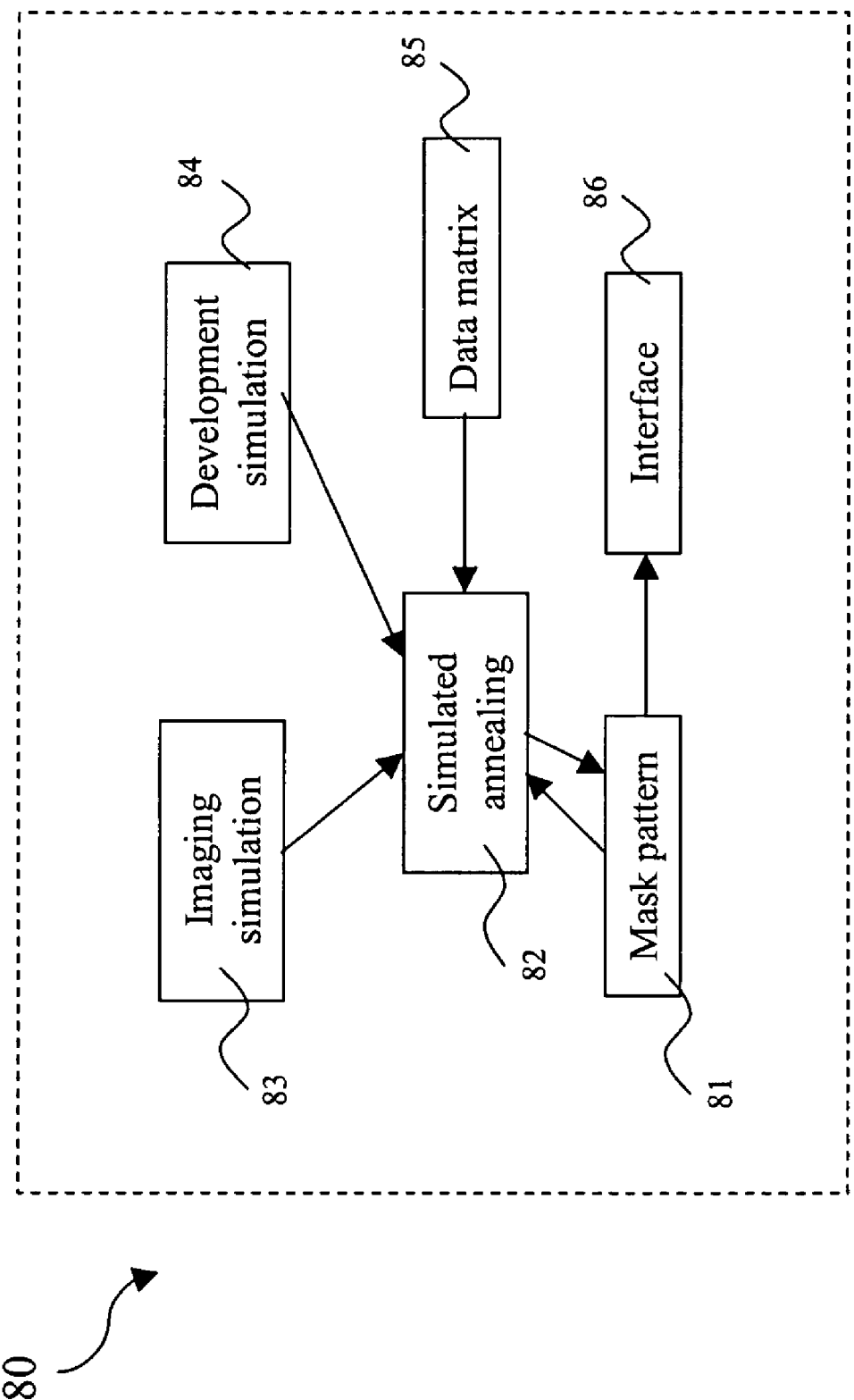
FIG. 8 is a block diagram of one embodiment of a system for generating and optimizing a mask pattern using the method of FIG. 3.

Referring to FIG. 8, illustrated is a block diagram of an exemplary system 80 to generate and optimize a mask pattern using the method of FIG. 3. The system 80 may include a mask pattern module 81 wherein a mask pattern is defined by a mask coefficient vector (or an array of pixels) and each element (or pixel) is represented by a mask transmittance coefficient having a transmittance and a phase. The array of pixels may be a regular array wherein each pixel has a constant transmittance and phase therewithin. The system 80 may include a simulated annealing (SA) module 82 to implement a SA method. The SA module 82 may further include other functions such as initializing a control parameter temperature, defining an annealing schedule, generating a new representative of the mask pattern, defining a cost function, calculating the cost function, evaluating the cost function to determine if the new representative of the mask pattern is accepted or rejected, and other functions for optimizing the mask pattern. The system 80 may further include a module 83 to simulate imaging the mask pattern to a substrate image on a substrate. The system 80 may further include a module 84 to simulate developing a layer of resist coated on a substrate in which an aerial image is converted into a resist pattern on the substrate (or a substrate pattern). The simulation of imaging and developing can be incorporated into the cost function to compare a substrate image with a target substrate pattern to optimize the mask pattern. The system 80 may include a module 85 to generate and store a data matrix to facilitate the calculation of the cost function. The data matrix comprises calculated convolution terms, which may be implemented by a lookup table having a kernel matrix. The system 80 may further include an interface 86 to take a target substrate pattern and present an optimized mask pattern to an user such as a mask designer. The system 80 may utilize the method 30 of FIG. 3.

Figure 9:
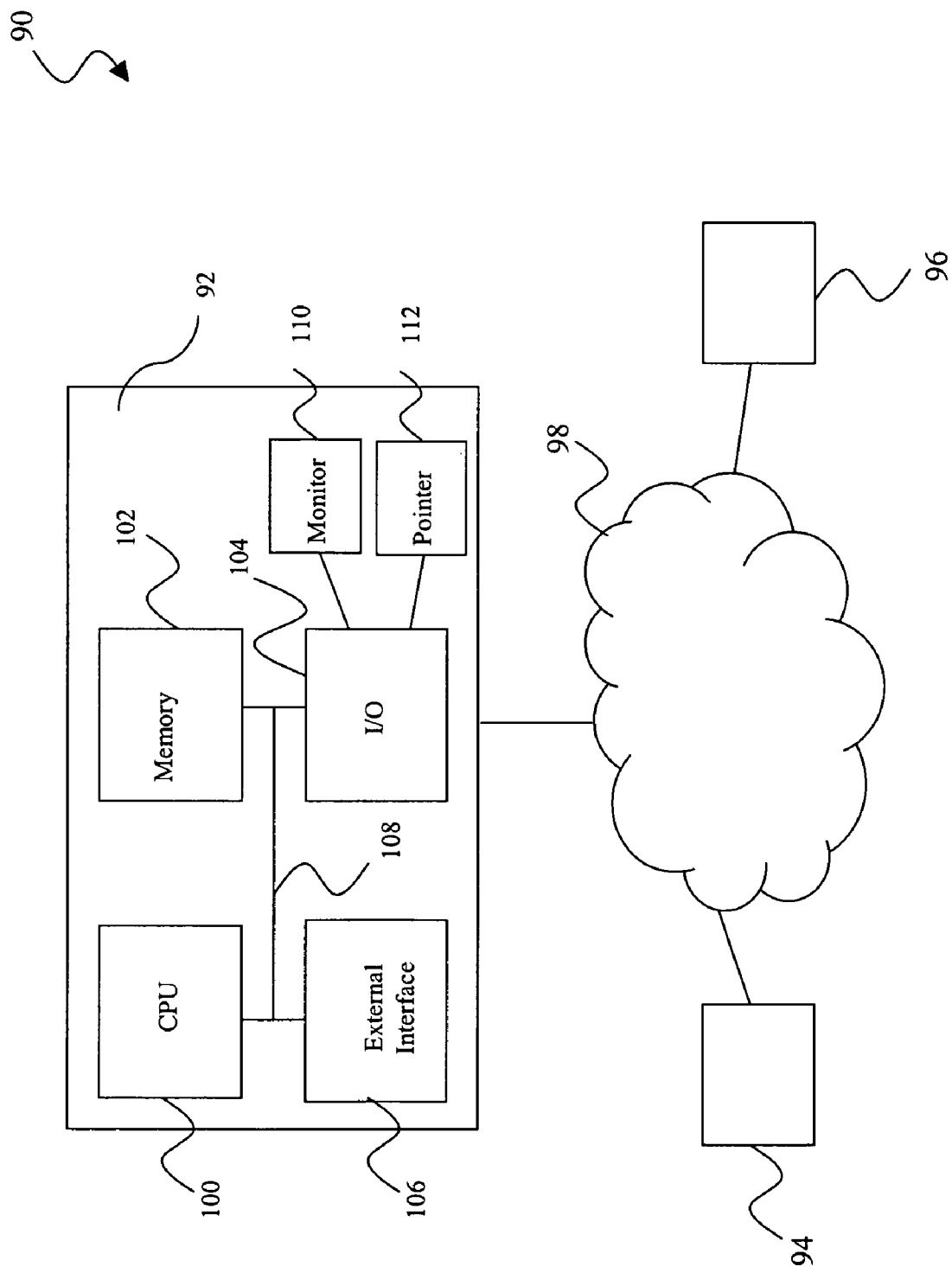
FIG. 9 is a schematic view of one embodiment of a computer that may be used within the system of FIG. 8 for implementing the method of FIG. 3.

Referring to FIG. 9, shown therein is an exemplary computing system 90 that may be used to implement the method and data manipulation discussed above. The system 90 may be incorporated into, as a part of, or include the system 80. The computing system 90 includes a plurality of entities represented by one or more entities 92, 94 and 96 that are connected to a network 98. The network 98 may be a single network or a variety of different networks, such as an intranet and the Internet, and may include both wire line and wireless communication channels.

Each of the entities 92, 94 and 96 may include one or more computing devices such as personal computers, personal digital assistants, pagers, cellular telephones, and the like. For the sake of example, the entity 92 is expanded to show a central processing unit (CPU) 100, a memory unit 102, an input/output (I/O) device 104, and an external interface 106. The external interface 106 may be, for example, a modem, a wireless transceiver, and/or one or more network interface cards (NICs). The components 100-106 are interconnected by a bus system 108. It is understood that the entity 92 may be differently configured and that each of the listed components may represent several different components. For example, the CPU 100 may represent a multi-processor or a distributed processing system; the memory unit 102 may include different levels of cache memory, main memory, hard disks, and remote storage locations; and the I/O device 104 may include a monitor 110, a pointer device (e.g., mouse) 112, and a keyboard.

In this example, the entity 92 may be connected to the network 98 through a wireless or wired link. The entity 92 may be identified on the network 98 by an address or a combination of addresses, such as a media control access (MAC) address associated with the network interface and an Internet protocol (IP) address. Because the entity 92 may be connected to the network 98, certain components may, at times, be shared with other internal entities. Therefore, a wide range of flexibility is anticipated in the configuration of the entity 92. Furthermore, it is understood that in some implementations, a server may be provided to support multiple internal entities 92. In other implementations, a combination of one or more servers and computers may together represent a single entity. It is understood that the entities 92, 94, and 96 may be concentrated at a single location or may be distributed, and that some entities may be incorporated into other entities.

Thus the present disclosure provides a method of designing and optimizing a mask layout. The method comprises representing the mask layout using a plurality of pixels each having a mask transmittance coefficient; initializing a control parameter; generating a representative of the mask layout; determining acceptance of the representative of the mask layout by a cost function and a Boltzmann factor wherein the cost function is related to the mask layout and a target substrate pattern, and the Boltzmann factor is related to the cost function and the control parameter; repeating the generating the representative and the determining acceptance until the mask layout is stabilized; decreasing the control parameter according to an annealing schedule; and reiterating the generating, the determining, the repeating, and the decreasing until the mask layout is optimized.

In this method, the representing the mask layout may comprise representing the mask layout by a regular array of pixels or an irregular array of pixels. The mask transmittance coefficient may be selected from a mask state vector comprising a plurality of elements. The generating a representative of the mask layout may comprise randomly selecting a mask transmittance coefficient from the mask state vector. The mask transmittance coefficient may comprise a transmittance and a phase. The transmittance may have a set of discrete states ranging between 0 and 1. The phase may have a set of discrete states ranging between 0 and 2 Pi. The determining acceptance may comprise accepting the representative if the cost function is relatively decreased. The determining acceptance may comprise accepting the representative with a probability using the Boltzmann factor if the cost function is relatively increased. The cost function may comprise simulating imaging the mask layout by a photolithography system. The cost function may comprise simulating developing a layer of photoresist on a substrate. The determining acceptance may comprise pre-calculating convolution terms in a data matrix. The pre-calculating convolution terms may comprise transforming a kernel matrix into a lookup-table. The annealing schedule may be exponentially decreased. The annealing schedule may be multiple-staged.

The present disclosure provides a method of generating a mask pattern. The method comprises representing the mask pattern by a mask coefficient vector comprising a plurality of elements each having a mask transmittance coefficient selected from a mask state vector; and optimizing the mask pattern using a simulated annealing method.

In this method, the simulated annealing may comprise a control parameter. The control parameter may change according to an annealing schedule. The simulated annealing method may comprise minimizing a cost function by randomly generating a new mask coefficient vector, the cost function relating to the mask coefficient vector and a target substrate pattern. The simulated annealing method may accept a new mask coefficient vector with a probability determined by a Boltzmann factor comprising the cost function. The cost function may be calculated using a data matrix having pre-calculated convolution terms. The pre-calculated convolution terms may be calculated using a lookup table having a kernel matrix. The cost function may be calculated over a set of control points predefined on a substrate. The simulated annealing method may comprise simulating imaging the mask pattern by a photolithography system. The simulating imaging may comprise a mask function, a lens transfer function, and a transmission cross coefficient function. The simulated annealing method may comprise simulating developing a layer of photoresist on a substrate. The simulating developing may comprise a film interference function, a film resist response function, and a resist development function. The mask coefficient vector may comprise a plurality of elements corresponding to a regular array of pixels having a constant shape and dimension. The mask coefficient vector may comprise a plurality of elements corresponding to an irregular array of pixels having various shapes and dimensions. Each element of the mask coefficient vector may comprise a set of transmittances ranging between 0 and 1, and a set of phases ranging between 0 and 2*Pi.

The present disclosure provides a system of generating a mask pattern. The system comprises a module of defining the mask pattern by a mask coefficient vector comprising a plurality of elements each including a transmittance and a phase; a module of optimizing the mask pattern using a simulated annealing algorithm wherein optimizing the mask pattern comprises evaluating a cost function; and a module of simulating imaging the mask pattern and developing a resist layer wherein the simulating converts the mask pattern into a substrate pattern and is incorporated into the cost function.

The system may further comprise a module to randomly generate a new mask coefficient vector for the simulated annealing algorithm. The system may further comprise a module configured for calculating the cost function using a data matrix having pre-calculated convolution terms.

The present disclosure may be used to design a mask pattern. The present disclosure may be used to find a particular mask pattern as a process-window monitor or a process-performance indicator. The present disclosure may also be used to find optimal shapes, sizes, and positions for assistant feature design and placement. The present disclosure may be used to optimize a mask design or generally used for designing a mask pattern incorporating new technologies such as PSM.

Although only a few exemplary embodiments of this invention have been described in detail above, those skilled in the art will readily appreciate that many modifications are possible in the exemplary embodiments without materially departing from the novel teachings and advantages of this invention. Also, features illustrated and discussed above with respect to some embodiments can be combined with features illustrated and discussed above with respect to other embodiments. Accordingly, all such modifications are intended to be included within the scope of this invention.

What is claimed is:

1. A method of designing a mask layout, comprising:
   representing the mask layout using a plurality of pixels each having a mask transmittance coefficient;
   initializing a control parameter;
   generating a representative of the mask layout;
   determining acceptance of the representative of the mask layout by a cost function and a Boltzmann factor, wherein the cost function is related to the mask layout and a target substrate pattern and wherein the cost function is calculated using a lookup table storing pre-calculated data, and the Boltzmann factor is related to the cost function and the control parameter;
   repeating the generating the representative and the determining acceptance until the mask layout is stabilized;
   decreasing the control parameter according to an annealing schedule; and
   reiterating the generating, the determining, the repeating, and the decreasing until the mask layout is optimized.

2. The method of claim 1, wherein the representing the mask layout comprises representing the mask layout by a regular array of pixels.

3. The method of claim 1, wherein the representing the mask layout comprises representing the mask layout by an irregular array of pixels.

4. The method of claim 1, wherein the mask transmittance coefficient is selected from a mask state vector comprising a plurality of elements.

5. The method of claim 4, wherein the generating a representative of the mask layout comprises randomly selecting a mask transmittance coefficient from the mask state vector.

6. The method of claim 4, wherein the mask transmittance coefficient comprises a transmittance and a phase.

7. The method of claim 6, wherein the transmittance has a set of discrete states ranging between 0 and 1.

8. The method of claim 6, wherein the phase has a set of discrete states ranging between 0 and 2 Pi.

9. The method of claim 1, wherein the determining acceptance comprises accepting the representative if the cost function is relatively decreased.

10. The method of claim 1, wherein the determining acceptance comprises accepting the representative with a probability using the Boltzmann factor if the cost function is relatively increased.

11. The method of claim 1, wherein the cost function comprises simulating imaging the mask layout by a photolithography system.

12. The method of claim 1, wherein the cost function comprises simulating developing a layer of resist on a substrate.

13. The method of claim 1, wherein the annealing schedule is exponentially decreased.

14. The method of claim 1, wherein the annealing schedule is multiple-staged.

15. A method of designing a mask layout, comprising:
representing the mask layout using a plurality of pixels each having a mask transmittance coefficient;
initializing a control parameter;
generating a representative of the mask layout;
determining acceptance of the representative of the mask layout by a cost function and a Boltzmann factor, wherein the cost function is related to the mask layout and a target substrate pattern, and the Boltzmann factor is related to the cost function and the control parameter;
repeating the generating the representative and the determining acceptance until the mask layout is stabilized;
decreasing the control parameter according to an annealing schedule; and
reiterating the generating, the determining, the repeating, and the decreasing until the mask layout is optimized, wherein the determining acceptance comprises pre-calculating convolution terms in a data matrix.

16. The method of claim 15, wherein the pre-calculating convolution terms comprises transforming a kernel matrix into a lookup-table.

17. A method of generating a mask pattern, comprising:
representing the mask pattern by a mask coefficient vector comprising a plurality of elements each having a mask transmittance coefficient selected from a mask state vector; and
optimizing the mask pattern using a simulated annealing method, wherein the simulated annealing method including simulating imaging of the mask pattern using a transmission cross coefficient function.

18. The method of claim 17, wherein the simulated annealing method comprises a control parameter that changes according to an annealing schedule.

19. The method of claim 17, wherein the simulated annealing method comprises minimizing the cost function by randomly generating a new mask coefficient vector, the cost function relating to the mask coefficient vector and a target substrate pattern.

20. The method of claim 19, wherein the simulated annealing method accepts a new mask coefficient vector with a probability determined by a Boltzmann factor comprising the cost function.

21. The method of claim 19, wherein the cost function is calculated over a set of control points predefined on a substrate.

22. The method of claim 19, wherein the simulated annealing method comprises simulating imaging the mask pattern by a photolithography system.

23. The method of claim 19, wherein the simulated annealing method comprises simulating developing a layer of photoresist on a substrate.

24. The method of claim 23, wherein the simulating developing comprises a film interference function, a film resist response function, and a resist development function.

25. A method of generating a mask pattern, comprising:
representing the mask pattern by a mask coefficient vector comprising a plurality of elements each having a mask transmittance coefficient selected from a mask state vector; and
optimizing the mask pattern using a simulated annealing method;
wherein the simulated annealing method comprises minimizing a cost function by randomly generating a new mask coefficient vector, the cost function relating to the mask coefficient vector and a target substrate pattern; and
wherein the cost function is calculated using a data matrix having pre-calculated convolution terms.

26. The method of claim 25, wherein the pre-calculated convolution terms are calculated using a lookup table having a kernel matrix.

27. A method of generating a mask pattern, comprising:
representing the mask pattern by a mask coefficient vector comprising a plurality of elements each having a mask transmittance coefficient selected from a mask state vector; and
optimizing the mask pattern using a simulated annealing method;
wherein the simulated annealing method comprises minimizing a cost function by randomly generating a new mask coefficient vector, the cost function relating to the mask coefficient vector and a target substrate pattern;
wherein the simulated annealing method comprises simulating imaging the mask pattern by a photolithography system; and
wherein the simulating imaging comprises a mask function, a lens transfer function, and a transmission cross coefficient function.

28. A system of generating a mask pattern, comprising:
a module configured for defining the mask pattern by a mask coefficient vector comprising a plurality of elements each including a transmittance and a phase;
a module configured for optimizing the mask pattern using a simulated annealing algorithm wherein optimizing the mask pattern comprises evaluating a cost function; and
a module configured for simulating imaging the mask pattern and developing a resist layer wherein the simulating converts the mask pattern into a substrate pattern and is incorporated into the cost function;
wherein the module for optimizing the mask pattern is in communication with a data structure housing a lookup table containing predetermined convolution terms.

29. A system of generating a mask pattern, comprising:
a module configured for defining the mask pattern by a mask coefficient vector comprising a plurality of elements each including a transmittance and a phase;

a module configured for optimizing the mask pattern using a simulated annealing algorithm wherein optimizing the mask pattern comprises evaluating a cost function; and a module configured for simulating imaging the mask pattern and developing a resist layer wherein the simulating converts the mask pattern into a substrate pattern and is incorporated into the cost function; and a module configured for calculating the cost function using a data matrix having pre-calculated convolution terms.

30. The system of claim 29 further comprising a module configured to randomly generate a new mask coefficient vector for the simulated annealing process.

* * * * *